United States Patent [19]

Drukier et al.

[11] 4,149,075
[45] Apr. 10, 1979

[54] METHODS AND DEVICES FOR DETECTING HARD RADIATION

[75] Inventors: Andrezej K. Drukier, Paris; Claude Valette, Villemoisson-sur-Orge; Georges Waysand, Paris, all of France

[73] Assignee: Agence Nationale de Valorisation de la Recherche (ANVAR), France

[21] Appl. No.: 745,115

[22] Filed: Nov. 26, 1976

[30] Foreign Application Priority Data

Nov. 28, 1975 [FR] France .............................. 75 36494
Nov. 28, 1975 [FR] France .............................. 75 36495

[51] Int. Cl.² ............................................. G01T 1/00
[52] U.S. Cl. .................................... 250/336; 250/395
[58] Field of Search ............... 250/336, 370, 371, 393, 250/395, 526

[56] References Cited

U.S. PATENT DOCUMENTS 4,037,102  7/1977  Hoyle et al. ................. 250/370 X Primary Examiner—Davis L. Willis
Attorney, Agent, or Firm—Ostrolenk, Faber, Gerb & Soffen

[57] ABSTRACT

The invention relates to a method of detecting electromagnetic or corpuscular radiation. In order to detect a radiation photon or particle, a homogenous particle of superconducting material of the first form is made to change from the metastable form of the superconducting state to the normal state by the action of a photoelectron expelled by the impact of the photon or particle of radiation on the particle of material.

35 Claims, 15 Drawing Figures

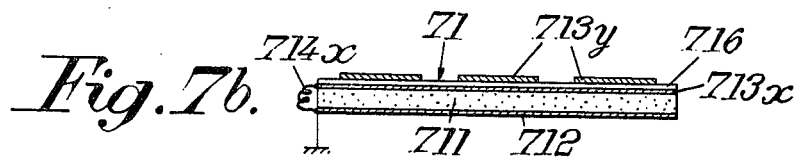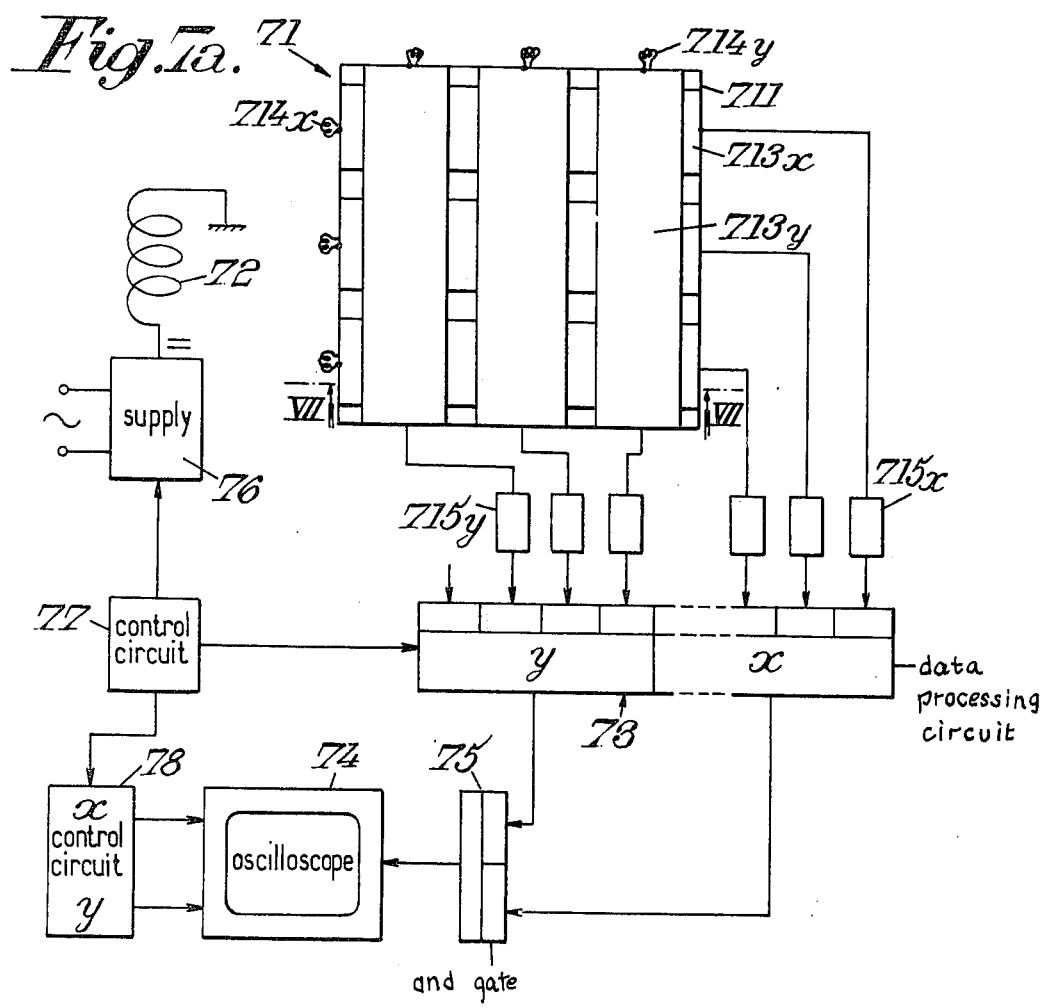

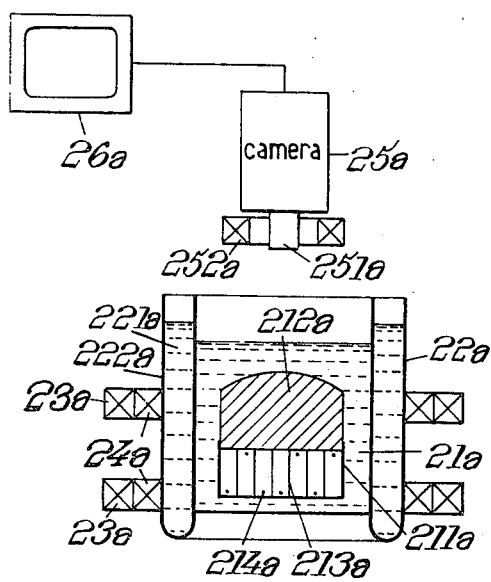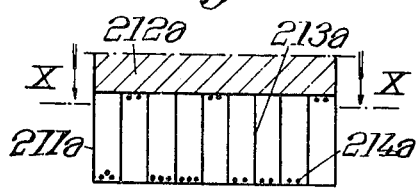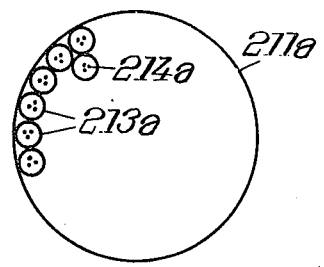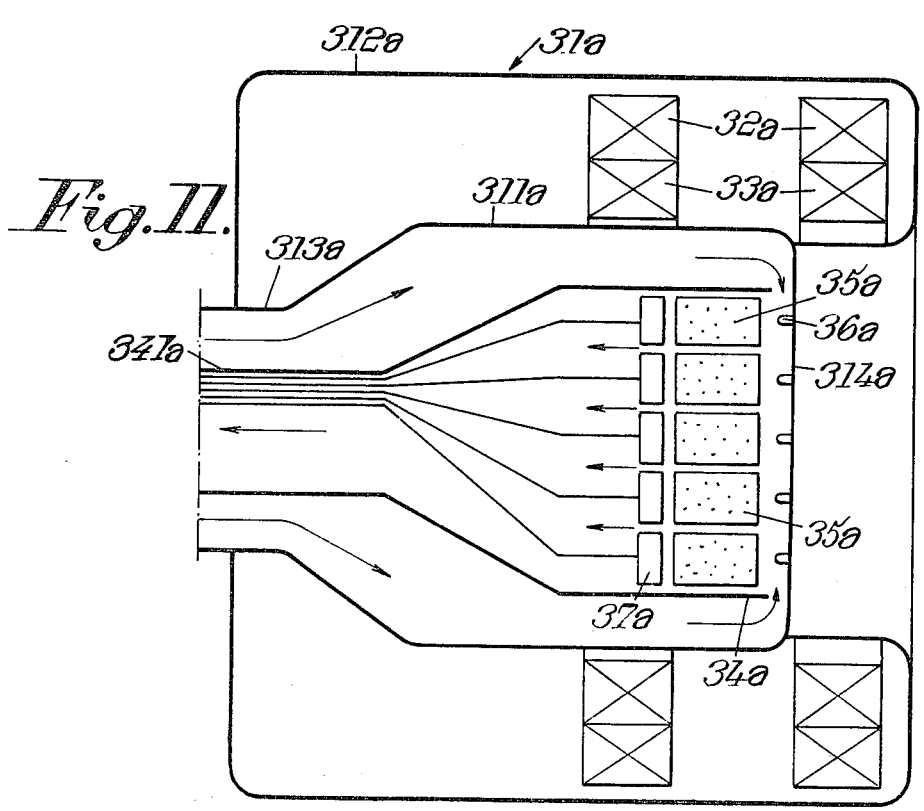

METHODS AND DEVICES FOR DETECTING HARD RADIATION

BACKGROUND OF THE INVENTION

The invention relates to methods and devices for detecting hard electromagnetic or corpuscular radiation, and to pick-ups associated with the devices. The term "hard" is applied to radiation having energy above a threshold which varies in different applications but is always higher than 5 keV. The pick-ups and associated devices may be used in radiography and also in transmission gammagraphy in biology, anatomy or medicine.

One object of the invention is to provide pick-ups of the aforementioned kind having extremely small dimensions so as to detect a beam having a very small cross-section and reconstruct an image from quasi-point measurements by scanning or tomography.

Another object of the invention is to provide surface pick-ups of the aforementioned kind for analyzing the distribution of radiation with very high definition.

Another object of the invention is to provide pick-ups of the aforementioned kind which can be associated with devices for displaying or storing radiation data and provided with individual means for transmitting and erasing the data.

Another object of the invention is to provide pick-ups of the aforementioned kind which can be associated with prior-art data display and storing devices for devices using known radiation pick-ups such as wire chambers.

Another object of the invention is to provide radiation detection devices using pick-ups according to the invention.

Another object of the invention is to provide methods of manufacturing pick-ups according to the invention.

Another object of the invention is to provide devices of the aforementioned kind which give a direct image of the distribution of radiation, i.e. without intermediate treatment.

Another object of the invention is to provide devices of the kind in question which are constructed to form rapid-access stores of radiation distribution, i.e. which display the data for the time judged necessary by the operator and can be instantaneously reset, i.e. returned to the measuring condition.

BRIEF DESCRIPTION OF THE INVENTION

The invention makes use of the properties of superconducting materials of the first form. It is known that, in these materials, the properties associated with the superconductive state have first-order transitions affected by hysteresis near the critical value of the ambient magnetic field; more particularly, when the intensity of the field surrounding the superconducting material is increased from a value substantially below the critical value, the superconductivity and the Meissner effect (i.e. the magnetic-field exclusion or expulsion effect) persist beyond the critical value, when the material is in a metastable state which is frequently called an "overheated state". It has already been shown by one of the inventors (thesis by Claude Valette, submitted to Paris-Sud University, Centre d'Orsay, entitled: "Contribution to research on the Meissner effect in non-uniform superconductors and in superconductors under metastable conditions", defended on Sept. 21, 1971) that the overheating of uniform spherical particles of a superconducting material of the first form is abruptly destroyed by beta radiation, which produces a transition to the normal state.

The invention is based on the fact that the impact of a photon or particle having sufficient energy results in the expulsion of a photo-electron which produces the transition. The impact can therefore be detected at the moment of impact, by measuring an electrical or magnetic quantity linked with the state of the material.

According to a first feature of the invention, the radiation receiver in the radiation detection device comprises a radiation pick-up comprising at least one homogeneous particle of a superconducting material of the first form, a cryostat for keeping the superconducting material in the superconductivity temperature range, means for producing a magnetic field in the space occupied by the pick-up, the field having a suitable value for keeping the material in a metastable superconducting state in the absence of radiation, and means for measuring a quantity or a variation in the quantity linked to the state of the material so as to detect the transition from the metastable superconducting state to the normal state under the action of a photo-electron produced by the impact of a particle or photon of radiation.

According to another feature, the device comprises at least one radiation detecting element in a cryostat, the element having one degree of freedom in translatory motion and containing at least one homogeneous particle of a superconducting material of the first form (e.g. mercury, tin or an indium-bismuth alloy) and field windings producing a magnetic field in the space occupied by the detector element or elements, the field gradient being parallel to the direction of translatory movement and the field intensity being such that the particle or particles of material are kept in a metastable superconducting state (frequency called "overheated state") in the absence of radiation, the orientation of the field being such that each detecting element is then held by magnetic levitation in a position at a distance from a return position determined by a non-magnetic return force. When a certain number of particles in a detecting element have changed over to the normal state, they no longer undergo a levitation effect and the detecting element returns to its return position; it is then possible to find out whether it has been exposed to radiation, by determining the position of a detector by an optical, electrical or other method.

In the proposed application, the pick-up can be a single particle or a uniform dispersion of particles in a solid which is a dielectric and can be in the shape of a rod or plate. In a preferred embodiment, the measuring means comprise at least one particle as its core and at least one circuit which detects the change in the reactance coefficient of the coil during the penetration of the magnetic flux associated with the transition.

The particle or particles of superconducting material for use in manufacturing a pick-up are first selected, depending on the intended application, by at least one sorting operation by settling followed by at least one sorting operation by levitation in a magnetic field having a gradient, the particles being chosen in accordance with their response to the field, i.e. in accordance with the value of the field which destroys the overheating effect. The device for sorting by levitation comprises a capsule in a cryostat, the capsule containing the particles for sorting in a vacuum or in the cryostatic fluid, the cryostat also containing Helmholtz coils for producing the field and anti-Helmholtz coils for producing the field gradient.

The radiation pick-up according to the invention is irreversible as long as the overheating field persists, since each particle of material stores the cause which has given rise to transmission; however the pick-up can be re-set by reducing the ambient field substantially below the critical value and then increasing it to the overheating value. The first-order transmission phenomena used by the invention, i.e. breaking a metastable balance which can be reproduced when desired, belong to the category of phenomena of change of thermodynamic order, some of which have already been used in prior-art radiation detection devices such as Wilson chambers, bubble chambers or wire chambers.

BRIEF DESCRIPTION OF THE DRAWINGS

Other features and advantages of the invention will be clear from the following description of embodiments of pick-ups and radiation detection devices according to the invention and from an example of a device for sorting superconducting particles. The description refers to the accompanying drawings in which:

FIGS. 7a and 7b are two sketches illustrating a second embodiment of the surface pick-up according to the invention and associated circuits, FIGS. 10a, 10b and 10c are diagrams of a detection device according to the invention in which the detectors are free particles; the position is found optically and the return is produced by gravity; and FIG. 11 is a diagrammatic cross-section of a device according to the invention, wherein the detectors are polymer resin rods containing particles and the return is brought about by a flow of cryostatic fluid.

In order to simplify the drawings, components not required for the understanding thereof have generally been omitted, e.g. some cryostat features such as pumping devices, joint planes of demountable elements, seals, double walls, etc., and some associated elements such as radiation collimators.

DETAILED DESCRIPTION OF THE INVENTION

Figure 1A:
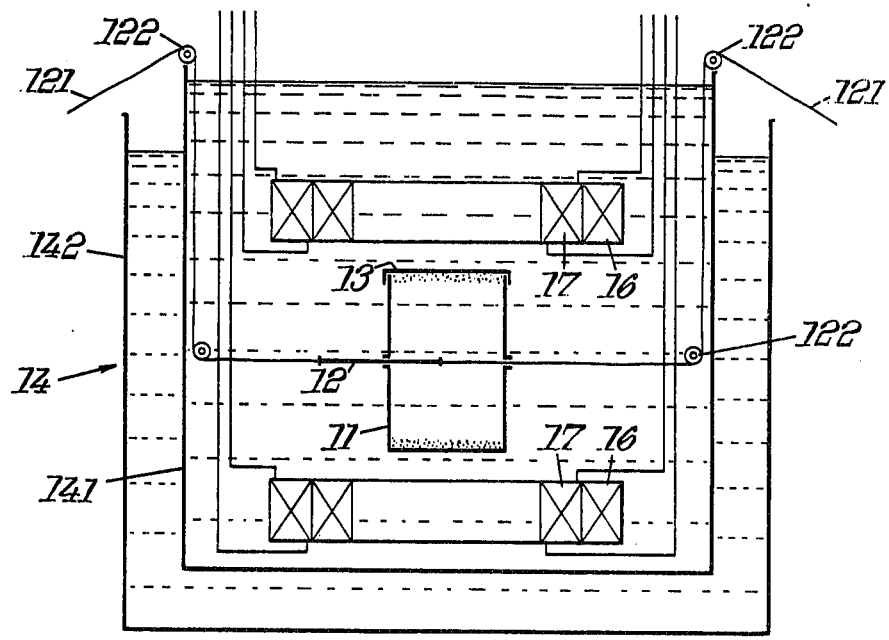
FIG. 1a is a diagrammatic cross-section through a first embodiment of the sorting device according to the invention.
Figure 1B:
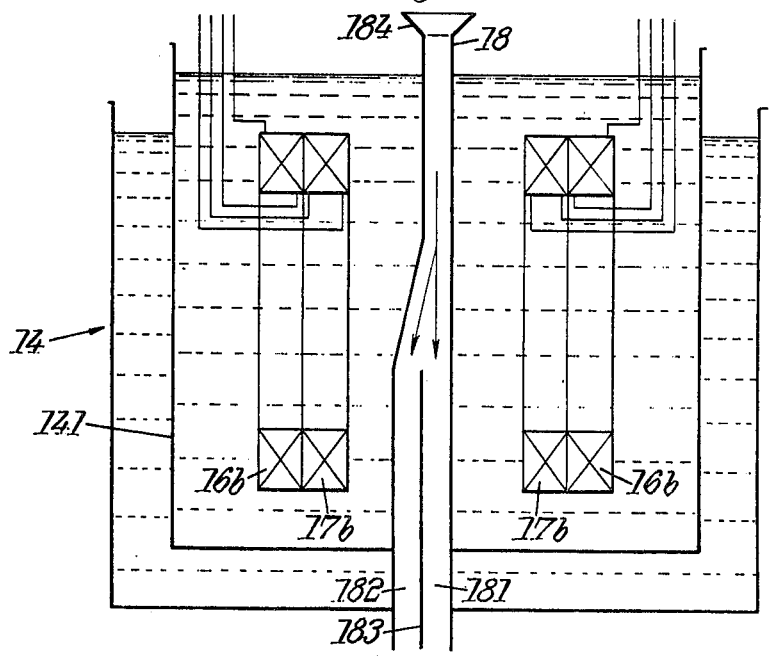
FIG. 1b is a diagrammatic cross-section through a second embodiment of the sorting device according to the invention.

Before considering FIGS. 1a and 1b, we must give some information about the method of obtaining particles of semiconducting material for forming detectors according to the invention, and about the characteristics which such particles must have. The particles must be spherical and have a uniform structure so as not to have "lags" in transition in the presence of a magnetic field; they must have the critical value, allowing for deviations in hysteresis; they must have substantially equal diameters; and they must "flip" from the superconducting state to the normal state at the same values of the ambient magnetic field.

Spherical particles are obtained by melting the material and emulsifying it in a bath of hot liquid agitated with an ultra-sonic probe. Of course, the liquid carrying the emulsion must not evaporate at the melting-point of the particles. When the material is tin or an indium-bismuth alloy, a mineral oil can be used to carry the emulsion.

The thus-obtained spherical particles are first sorted by settling, whereby particles having similar diameters (e.g. 4 or 5 microns) can be selected with very close approximation. The selected particles are subjected to a second sorting operation by magnetic levitation, using the device in FIG. 1a, which comprises a capsule 11 in which the particles for sorting are placed. The slide 12 can slide in the center region of capsule 11 and divide it into two separate chambers. When the particles have been placed in position, capsule 11 is covered by a cover 13 and disposed in a liquid helium bath in a known cryostat 14 comprising two chambers — an inner chamber 141, containing the helium bath, and an outer chamber 142 cooperating with enclosure 141 to bound a protective space filled with liquid nitrogen.

Slide 12 can be operated from outside the cryostat, using a device represented by wires 121 guided by rollers 122.

In FIG. 1a it is assumed that the immersed capsule is filled with liquid helium. However, there is no reason not to use a a capsule comprising a sealing-tight slide and cover and evacuated before immersion.

Cryostat 14 has two pairs of annular coils 16, 17 disposed around capsule 11. The coils are supplied with d.c. to produce a magnetic field having a field gradient in the space which they bound. Coils 16 are Helmholtz coils, i.e. they are dimensioned, disposed and energized so as to produce a uniform magnetic field. The value of the field is the same as that of the overheating field to which the particles are subjected in the detector. The "anti-Helmholtz" coils 17 are dimensioned, disposed and energized so as to superpose a field gradient oriented in the opposite direction, e.g. an ascending gradient, on the field of coils 16.

When capsule 11 is disposed in the cryostat, all the particles are in the superconducting state. Slide 12 is in the opening position. The Helmholtz coils 16 are energized, followed by energization of the anti-Helmholtz coils 17. The particles which have flipped to the normal state remain at the bottom of capsule 11, whereas the particles which have remained in the superconducting state are attracted to cover 13 by the Meissner effect. Slide 12 can be operated so as to keep the two kinds of particles separate when capsule 11 is taken out of the cryostat. Clearly, since the sorting operation by levitation can be repeated, it can be used to select particles sensitive to an overheating-field value which is within very narrow limits, e.g. 345 350 gauss, thus obtaining detectors sensitive to an exact energy value, which is the energy corresponding to one end of the gamma spectrum. It is even possible to isolate a single particle, thus obtaining a quasi-point detector. The detector yield, i.e. the proportion of particles which change to a given energy level, improves in proportion to the rigour with which the particles for forming the pick-up are selected. The particle size determines the minimum energy level of the response and the time during which the superconducting state is interrupted. These quantities are small in proportion to the fineness of the particles. Conversely, larger particles are correspondingly more sensitive to interfering diffusion radiation. When the particles are being sorted by levitation, they can be irradiated by a single-energy radioactive source in order to select those particles which are sensitive to a given energy threshold.

FIG. 1b shows another embodiment of the sorting device, which is for "continuously" selecting particles. The Helmholtz coils 166 and the anti-Helmholtz coils 17b are disposed in the inner vessel 141 of cryostat 14 so that the magnetic field gradient is towards the left in the drawings. A vertical duct 18 made of non-magnetic material extends through the cryostat. Its bottom part is divided into two channels 181 and 182 by an inner wall 183. Channel 181 is dimensioned and disposed in line with the top part of duct 18. The particles for sorting are introduced through mouth 184 at the top. The particles which remain superconducting are deflected by the magnetic gradient and fall into channel 182. The others fall into channel 181.

It is often necessary to disperse the particles in a dielectric binder which is solid at least in the lower range of operating temperature. A large number of binders can be used but it is usually advantageous to choose an epoxy resin, since this class of polymers has the advantage of not being cracked by changes in temperature; the resulting surface detectors can be kept at ambient temperature. The dispersion is produced by introducing a powder made up of particles into the liquid resin, mixed with a hardening agent and catalyst if required, after which the mixture is agitated by an ultrasonic probe. Depending on whether the selected resin is thermoplastic or thermosetting, the period of agitation and the temperature are chosen so that the particles are uniformly distributed when the resin has a viscosity such that segregation of the particles is impossible. Next, the resin is shaped, e.g. by producing plates by rolling or wires or rods by drawing. Since the particles are thus imprisoned in the dielectric, they need not be made of a material which remains solid at ambient temperature. For example, the super-conducting material can be mercury. The dispersion is produced in a cryostat in an alcohol containing a wetting agent such as sodium oleate, the temperature being lowered during the operation so that the mercury droplets solidify in spherical form. The liquid phase is then eliminated, at low temperature as before, by evaporation in vacuo. The particles are easy to select by levitation, since the process occurs in a cryostat. The surface detectors, provided they are kept in the cold, can be constructed by using a binding agent which is a liquid delectric such as a fat, which has a solidification temperature below that of mercury. Alternatively, use can be made of a polymerizable resin such as an epoxide, which is polymerized by rapid heating after emulsification, so as to prevent the mercury droplets from segregating and coalescing. The detector can thus be kept at ambient temperature, since the liquefied particles of mercury re-solidify and return to the superconducting state when used in the cryostat.

In a general manner, the previously-mentioned process describes the dispersion of particles in the dielectric so as to obtain pick-ups containing a high proportion of particles (up to 50% by volume) and thus having excellent spatial resolution if the grains are fine. In view of the methods of read-out, which will be described hereinafter, it does not matter if adjacent particles are in contact. The essential point is to avoid conglomerations of particles and gaps.

Figure 2:
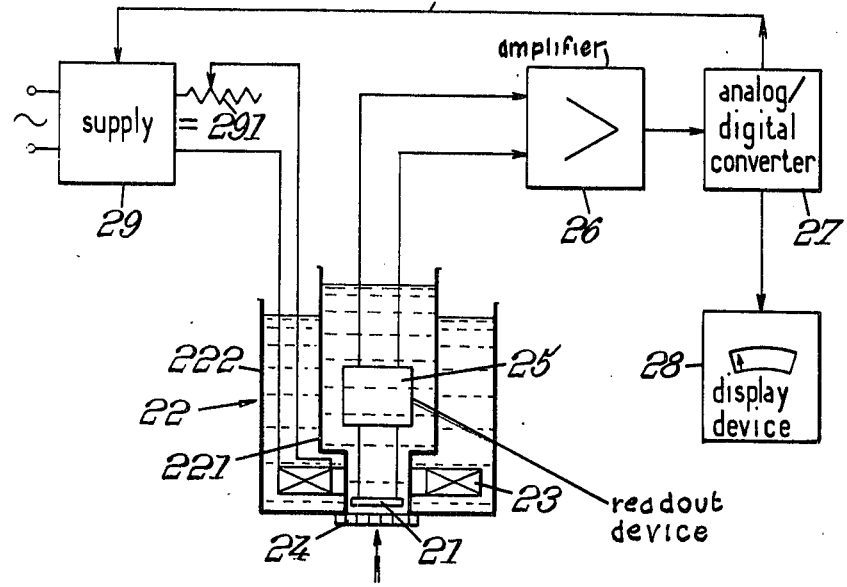
FIG. 2 is a general diagram of the detection device according to the invention.

FIG. 2, as already stated, is a general diagram of the detection device according to the invention. A detector 21 comprising superconducting particles, examples of which will be given later, is disposed in an inner vessel 221 of a helium cryostat 22 near the bottom of the vessel, so that it is cooled by a thin stream of helium which is renewed by convection. Coil 23, used for subjecting detector 21 to the overheating field, is immersed around the detector in the protective space bounded by a vessel 222 containing liquid nitrogen. A source of gamma rays under observation, e.g. a biological preparation injected with a solution of a radioactive substance, is disposed under the cryostat. The radiation travels through a known (e.g. honeycomb) anti-diffusion collimator 24 placed against the bottom of the cryostat. The bottom is made of material permeable to radiation, such as light metal, aluminium, beryllium, etc., or a polymer-glass-fibre laminate. A read-out device 25, embodiments of which will be described later, is also immersed in the cryostat. Device 25 is adapted to deliver electric signals for detecting a change of state in the superconducting particles of detector 21 under the combined action of the overheating field imposed by coil 23 and the emission of photo-electrons resulting from the energy lost by photons of radiation when they strike the particles. The signals from the read-out circuit 25 are amplified by stage 26 and, if necessary, processed by an analog-numerical converter 27 and displayed or stored by a device 28. The d.c. through field coil 23 is delivered by a source 29. Source 29 comprises control means (symbolized by a rheostat 291) for adjusting the intensity of the overheating field. Converter 27 comprises a control clock (not shown) which can be used to prepare cut-off signals which follow each measuring operation and are sent via a connection 271 to a control input of source 29. The signals temporarily cut off the supply current of coil 23 so that the particle or particles in detector 21 return to the superconducting stage before the next measurement. The sensitivity of the pick-up improves in proportion to the permeability to radiation of the walls separating the pick-up from the source of radiation. In some applications, the preparation (immersed in the cryostat) can be applied to the pick-up surface.

Figure 3:
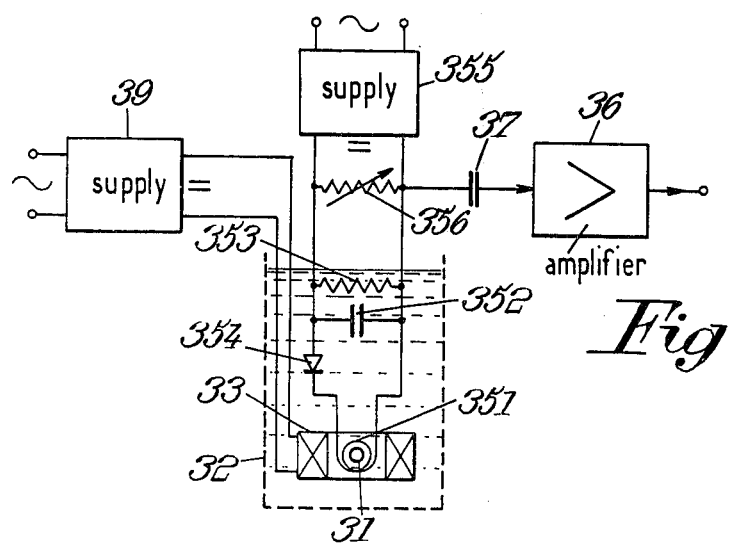
FIG. 3 is a diagram, partly in the form of a block diagram, of a first embodiment of the invention.
Figure 4:
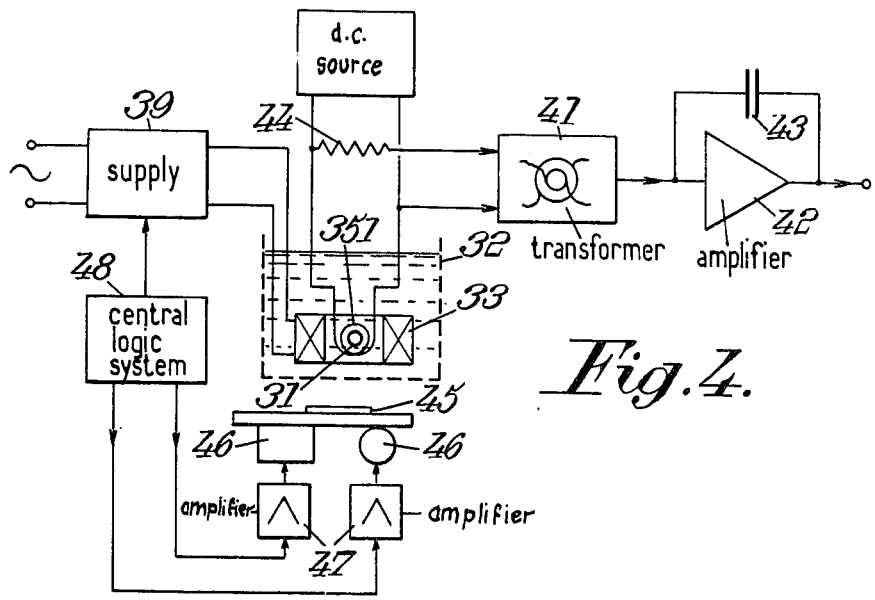
FIG. 4 is a diagram of a second embodiment of the invention.

We shall now describe the detector read-out circuits. In theory a number of methods can be adopted, since it is required to measure a property associated with the state of the particles, such as the resistivity, the specific heat, the thermal conductivity, the acoustic impedance, etc. However, some of these properties are not suitable for local measurement using simple means. Others, such as the resistivity, cannot be determined except by direct contact with the detector. On the other hand, the magnetic properties can be measured by simple means and do not require direct contact. FIGS. 3 and 4 relate to circuits using this method. The drawings show only the outer walls of the cryostat, represented by broken lines. The store and display devices are omitted. It has been assumed that the detector contains only one particle but, as will be seen hereinafter, the same methods of mesurement could be used with surface detectors comprising a number of particles. In both circuits, the parameter used for measurement is the self-inductance of a detecting coil having the detecting particle as its core.

In FIG. 3 a detecting particle 31, immersed in cryostat 32 and placed in the overheating field radiated by coil 33, is surrounded by an inductance coil 351, which forms an element of an oscillating circuit also comprising a capacitor 352 and a resistor 353 energized by a diode 354 polarized by a supply 355 comprising voltage adjustment means symbolised by a potentiometer 356. The current delivered by the oscillating circuit energizes amplifier 36 via a decoupling capacitor 37. The output of amplifier 36 is connected to measuring or data-processing devices (not shown) e.g. a frequencymeter. Since the frequency of the circuit depends on the self-inductance coefficient of coil 31, it is affected by the penetration of the flux into the core formed by particle 31. The entire oscillating circuit is immersed in the cryostat. A simple calculation shows that the variation in the circuit frequency produced by penetration of the flux is in inverse proportion to the distance between particle 31 and coil 351.

As should be apparent to one skilled in the art, the circuit of FIG. 3 can also be used as a flux meter since the signal detected by amplifier 36 is a function of the penetration of the flux into the core formed by particle 31. This circuit should not, however, be utilized as a flux meter if the detecting particle 31 is very small.

FIG. 4 shows another detection device for dynamic measurement of the flux penetration. Components similar to those in FIG. 3 bear like references. The detecting coil 351 is connected to the primary coil of an impedance-increasing transformer 41, whose secondary coil is connected to the inputs of a capacitive negative-feedback differential amplifier 42. The feedback loop is symbolized by a capacitor 43.

The induced signal is proportional to the particle diameter. Amplifier 22 acts as a rapid-response ballistic galvanometer. If, for example, it is connected to an oscillograph, the penetration of the flux into the particle is represented by a signal peak.

It can be calculated that, if the average diameter of the turns in coil 351 is 30 microns, the induced voltage is 10 mV for a particle diameter of 10 microns and 1 mV for a particle diameter of 1 micron.

Consequently a circuit as shown in FIG. 4, if its components are suitably chosen, can be used to obtain a signal which is detectable for very small-diameter particles and has a value compatible with logic circuits conventionally used for processing the data from known radiation detectors such as wire chambers. A circuit of this kind, which can be used with an isolated particle, has an advantage in that it can be used to analyze the rise of the detection signal, and can therefore be used to calculate the characteristics of surface detectors, embodiments of which will be described hereinafter.

A single-particle detector can be used to analyze a radiation flux such as that emitted by a biological preparation, if the detector or the preparation is subjected to a scanning motion. FIG. 4 gives an example of the device in which the motion is imposed on the preparation. The preparation is supported by a table 55 moved in two perpendicular directions by step-by-step motors 46 actuated by amplifiers 47. The amplifiers are actuated by signals prepared by a control logic system 48 comprising a clock (not shown) which, during each motion control signal, addresses an interruption signal which disconnects the current supplying winding 33 via supply 39. Between each measurement, the detector flips to the superconducting state. Amplifier 42, which operates as a ballistic galvanometer, returns to zero after each measurement and is ready for fresh operation.

Figure 5:
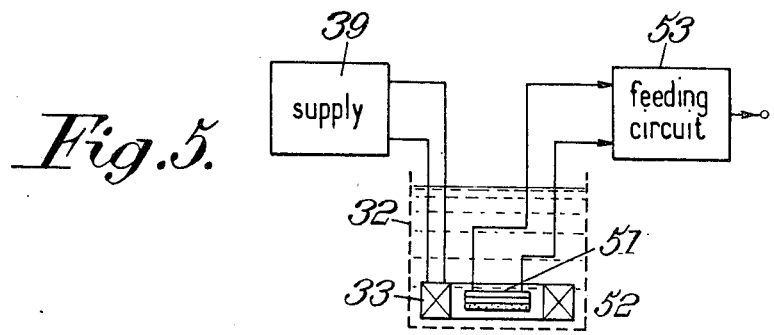
FIG. 5 is a diagram of a third embodiment of the invention.

FIG. 5 is a diagram of a first embodiment of a device according to the invention using a surface detector. Components identical with those already shown in FIGS. 3 and 4 are given the same reference numbers. As already stated, detector 52 is made up of particles of superconducting material dispersed in an epoxy resin plate. The read-out device 51 is a known magneto-optical converter comprising light modulators containing Kerr or Pöckels cells or nematic crystals. It is supplied by a circuit 53. The input surface is secured against the surface detector 52. The image can be observed via the opposite surface, i.e. inside the cryostat 32.

We shall now describe surface detectors according to the invention which comprise reactive circuits for obtaining localized readings by the methods already described with reference to FIGS. 4 and 5.

Figure 6:
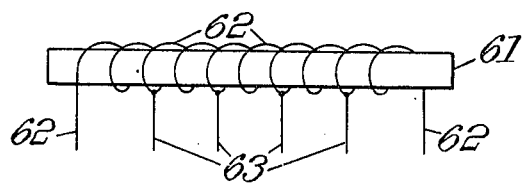
FIG. 6 is a sketch of a first embodiment of a surface pick-up element according to the invention.

FIG. 6 shows an example of a linear detector which can be used to form a surface detector, by juxtaposition of similar elements. The linear detector comprises a small-diameter cylindrical portion 61 obtained by drawing epoxy resin charged with the particles (which are not shown). A conductor 62, which can have contiguous turns if it is insulated, is wound round the cylindrical portion and is connected to a number of inductance-coil terminals 63 which can be connected to supply, detection and data-processing circuits which have not been shown but are similar in construction to the corresponding circuits in FIGS. 3 and 4 and consequently known to the skilled addressee. In this manner, the data relative to each inductance coil can be recorded or displayed during a measurement. The inductance-coil portions in the juxtaposed elements thus bound measurement ranges which can be made very small. The disadvantage of this kind of pick-up is that, in theory, it requires a number of read-out circuits equal to the number of measuring ranges.

We shall now examine FIG. 7a, which shows a surface pick-up comprising read-out conductors arranged in a matrix and the associated circuits, and FIG. 7b, which is a cross-section along line VII—VII of the pick-up in FIG. 7a. The matrix arrangement considerably reduces the number of connections and read-out circuits.

Pick-up 71 is a thin epoxy resin plate 711 in which the detecting particles are uniformly dispersed. The bottom surface of the plate (in FIG. 7b) is covered with a metal sheet or deposit 712 forming an earth or return conductor. The top surface is covered with a number of parallel metal strips 713x each having one end connected to the ground plane 712 by a conductor 714x.

Strips 713x are covered with an insulating layer 716, e.g. of epoxy varnish, which separates them from other strips 713y which are perpendicular thereto and each have one end connected to the ground plane 712 by a conductor 714y.

Strips 713x and y are also connected by their ends which are not connected to plane 712, to an output (e.g. the "minus" output) of a d.c. supply circuit (not shown) by conductors 715x and y. The ground plane 712 is itself connected to the opposite-sign output of the same supply circuit.

Each conducting strip 713x or y cooperates with the ground plane 712 to form a looped circuit having a self-inductance which varies in a manner which can be determined from the transition of an array of super-conducting particles disposed somewhere in the loop. Consequently the position or "address" of any array of superconducting particles in which a transition is brought about by radiation can be determined by the position of two orthogonal loops whose self-inductance coefficients are simultaneously affected, provided of course that the response of the read-out and processing circuits is sufficiently rapid to avoid any confusion.

In order to simplify FIGS. 7a and 7b, the number of strips 713x and y has been arbitrarily reduced and their width increased. In reality, of course, the strips can be very thin (a few tens of microns) and there can be a large number of them (e.g. about 100 strips x and a 100 strips y). The strips can be made by any known means, such as sticking a metal tape, or deposition in vacuo with masking. Alternatively, the strips may be replaced by intersecting cylindrical conductors. In addition, the pick-up can be constructed in a different manner from that shown in FIG. 7b, e.g. from intersecting insulated wires stuck to a support and coated with an epoxy resin charged with particles of superconducting material. The earth or return plane 712 can be replaced by intersecting strips or wires, each forming a loop with the facing conductor 713x or y.

The drawings do not show the cryostat in which the pick-up is immersed. The field winding surrounding the pick-up in the cryostat is symbolically indicated by a winding system 72 disposed beside the pick-up in FIG. 7a.

It is not necessary for the loop-signal processing and data-processing circuits to be described in detail, since they can be constructed by any skilled addressee after their functions have been defined. However, the following components are shown by way of example:

A read-out circuit 715x or y associated with each loop and designed in similar manner to the circuit illustrated in FIG. 4 or FIG. 5;

A data-processing circuit 73 having inputs downstream of circuit 715 and divided into two groups associated with loops x and y respectively; each input group comprises an analog-numerical converter followed by a parallel-series numerical converter;

a display means, i.e. an oscilloscope 74;

an analog "AND" gate 75 delivering brightness signals to oscilloscope 74 and in turn actuated by outputs x and y of circuit 73;

a supply 76 for the field winding 72; and

A logic control circuit 77 which triggers the scanning of the pick-up loops by circuit 73, the delivery of the output signals stored by circuit 73, scanning by oscilloscope 74 initiated by a control circuit 78, and switching off supply 76 to cut off the overheating field delivered by winding 72 so that pick-up 72 can be re-set between any two measurement sequences, i.e. all the particles in the pick-up return to the superconducting state.

Figure 8:
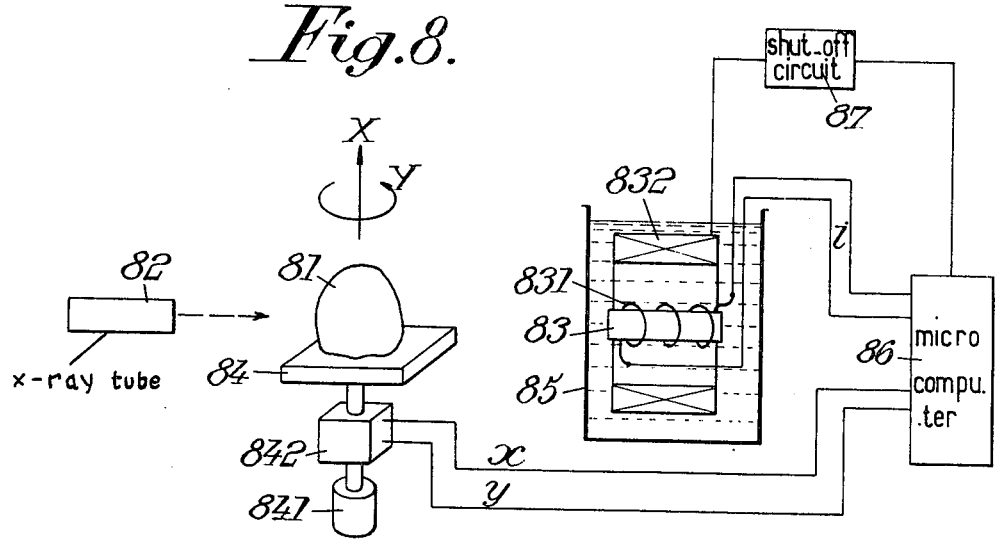
FIG. 8 is a diagram of a scanning radiography device using a detector according to the invention.

As already mentioned, FIG. 8 shows an X-ray scanning device using a pick-up according to the invention made up of a number of superconducting particles in the overheated state and disposed in a dielectric. A sample 81 for observation is disposed between an X-ray tube 82 delivering a thin cylindrical beam and a pick-up 83 immersed in a cryostat 85. Pick-up 83 is inserted in a detecting coil 831 surrounded by a field coil 832. The current i produced in coil 831 is proportional to the number of particles in pick-up 83 which flip over to the normal state when acted upon by incident radiation.

Sample 81 is secured to a support 84 which can be moved, by means of a device 841 comprising step-by-step motors, in translatory motion in a direction X at right angles to the beam, and in rotation Y around axis X. Position detectors 842 address signals x and y corresponding to the linear position X and the angular position Y respectively of support 84.

A micro-computer 86 receives signals i, x and y and actuates a printer and a plotting table (not shown) so as to record the values of the signals and plot the corresponding absorption graph.

A circuit 87, likewise controlled by computer 86, shuts off the supply to the field coil 832 during the motion of support 84 between each measuring position, so as to re-set pick-up 83. The pick-up can be made much smaller than radiation pick-ups in known "scanners", and can withstand much higher fluxes without saturation, i.e. the images are better defined and obtained more quickly.

Figure 9:
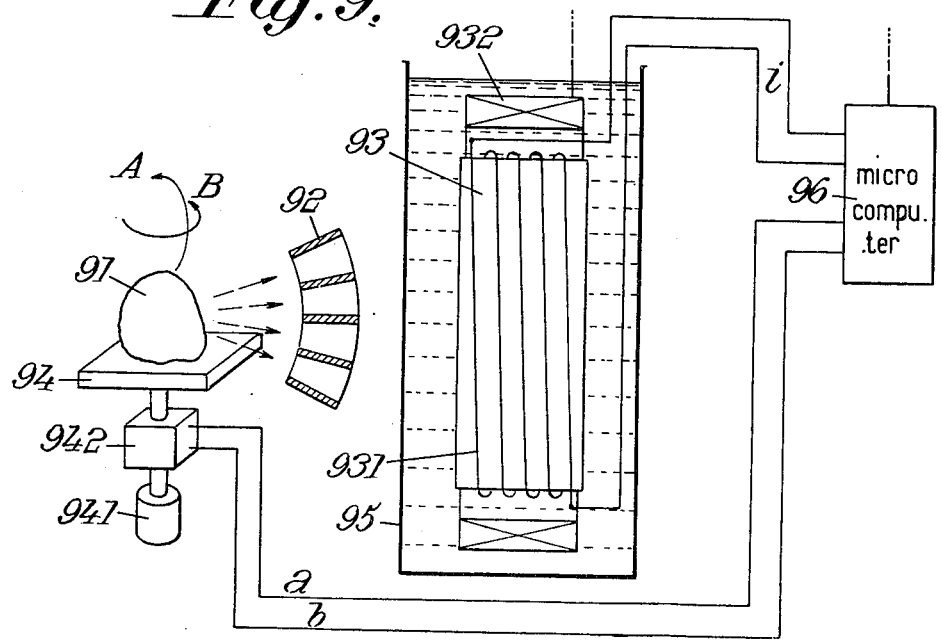
FIG. 9 is a diagram of a device for emission gammagraphy by tomography using the detector according to the invention.

FIG. 9 shows a device for emission gammagraphy by tomography likewise using a pick-up according to the invention. The radiation source is a sample 91 containing a radioactive element emitting gamma-rays. Pick-up 93, which is inserted in a detecting winding 931 and subjected to the field of field coil 932 in cryostat 95, has a similar structure to the pick-up in 83 in FIG. 8, but its dimensions are sufficient to cover the useful radiation field bounded by a known collimator 92. In FIG. 9, the movements of support 94 are angular movements in two orthogonal planes A and B. They are brought about by a step-by-step motor system 941 and are measured by a position detector 942 which delivers signals a and b corresponding to angular movements in plane A and B respectively. As in the device in FIG. 8, a micro-computer 96 processes signals a and b and signal i from coil 932 so as to actuate data display devices (not shown) and re-set the pick-up.

Compared with known "Auger"-type devices, the device in FIG. 9 has the advantage not only of providing measurements at much more intense fluxes but also of more completely eliminating lack of sharpness due to diffusion, since the structure and dimensions of the superconducting particles of pick-up 93 and the intensity of the field of coil 932 can be adjusted so that the particles have a change-over threshold such that they are insensitive to the diffused radiation.

We shall now consider FIGS. 10a, 10b and 10c, which diagrammatically indicate a first embodiment of the device according to the invention, characterised in that the detecting elements therein are free particles whose position is located by an optical device, the particles being returned by gravity when subjected to magnetic levitation. FIG. 10a is an axial section through the assembly, FIG. 10b is a larger-scale partial axial section, and FIG. 10c is a diametral section along plane X—X in FIG. 10b.

In capsule 21a is immersed in an inner vessel 221a of a helium cryostat 22a close to the bottom of the vessel, so that it is cooled by a thin sheet of liquid helium which is renewed by convection. The outer vessel 222a bounds a protective space filled with liquid nitrogen. Capsule 21a comprises a casing 211a made of non-magnetic material such as glass or austenitic steel, closed by a Stanhope lens 212a. The interior of casing 211a is divided into vertical ducts 213a by glass capillary tubes or honeycomb partitions made of austenitic steel. Each duct contains at least one particle 214a of superconducting material of the first form, e.g. mercury, tin, indium, indium-bismuth alloy, lead or thallium.

Two pairs of annular coils 23a, 24a are disposed around the outer vessel 222a and are supplied with d.c. to produce a magnetic field having a field gradient in the space which they bound. Coils 23a are Helmholtz coils in which the direction of the current is such that it produces a uniform field oriented towards the bottom of the cryostat. Coils 24a are anti-Helmholtz coils in which the current flows so as to produce a field gradient oriented upwards. The values of the field and the field gradient are determined in accordance with the desired sensitivity of the detection device, i.e. the radiation energy threshold at which it is to respond. The coils need not be disposed around the cryostat vessel; they can be placed inside or even in the protective space.

When capsule 21a is immersed in the cryostat and subjected to the fields produced by coils 23a and 24a, all the particles are in the metastable superconducting state and, owing to the field expulsion or Meissner effect, behave like magnetic bubbles and are driven towards the top of the capsule. The ducts 213a are needed for preventing the particles from moving away from one another towards the edges of the capsule.

As is known, a Stanhope lens such as lens 212a does not give a clear image (seen at infinity by an observer) except of objects disposed against its flat surface, and it also concentrates the ambient light on the objects. Thus, the levitated particles appear as bright, clear spots. On the other hand, the particles which have undergone transition as a result of the radiation and arrive at the bottom surface of the cryostat as shown in FIGS. 10a, 10b and 10c, are not levitated and fall to the bottom of ducts 213a. They do not appear in the field of lens 212a and their images are lost in the optical background. Consequently, direct examination through lens 212a shows the distribution of pencils having an energy above a given threshold, in the cross-section of a beam of radiation intercepted by the detector. The threshold can be adjusted, e.g. by varying the particle size, to eliminate the effect of diffused radiation in the substance which is to be imaged.

If a screen opaque to radiation is placed between the beam and the detector and if coils 23a are de-energized to eliminate the overheating field, all the particles become superconducting and return to lens 212a and the detector is ready for a new examination. A graph showing the distribution of radiation energy for each class of energy values can be prepared by making a number of measurements on the beam, using different values of the overheating field.

Clearly, what is seen through lens 212a can be displayed or recorded. FIG. 10a shows an example of a television display system. An objective 251a of a camera 25a is surrounded by diffused-light sources 252a disposed in a circle. Camera 25a is connected to a television receiver 26a for recording purposes, either by photographing the screen or simultaneous examination by a number of observers. Alternatively, the television system can be replaced by an ordinary photographic device.

The detection device described hereinbefore is compact, easy to construct and inexpensive. It can give very high definition, since very fine ducts 213a can be formed from commercially-available capillary tubes having a diameter of a few tens of microns. Particles having a diameter of a few microns can be selected and a number of particles can be placed in each duct. However, the device in FIGS. 10a, 10b, 10c is suitable only when radiation arrives at its bottom surface, since the particles are returned by gravity. The device in FIG. 11 does not have the same disadvantage. In addition, the detecting elements therein are rods containing dispersed particles. The position is detected by electric means. All these features are interchangeable with those shown in FIGS. 10a, 10b and 10c.

In the device in FIG. 11, the return is brought about not by gravity but by a flow of cryonic fluid, e.g. liquid or gaseous helium. Consequently, the direction of the radiation is unimportant. The cryostat 31a, which is substantially cylindrical and has a horizontal axis, comprises an inner vessel 311a and an outer vessel 312a. The two vessels bound a protective space filled with liquid nitrogen. The overheating field is produced by Helmholtz coils 32a and anti-Helmholtz coils 33a disposed in the protective space. A cylindrical jacket 34a made of non-magnetic metal or other material is coaxial disposed in vessel 311a and cooperates therewith to form an annular passage. At the open end of the cryostat, jacket 34a is connected to a pipe system 341a and vessel 311a is connected to a pipe system 313a. Jacket 34a ends at a short distance from the bottom 314a of the cryostat. Pipe systems 313a and 341a are connected to a helium-pumping cryogenic installation (not shown). Jacket 34a contains araldite rods 35a charged with particles of superconducting material and arranged in compact manner but with clearance so that they can slide relative to one another. In the case shown in FIG. 11, helium flows in the direction of the arrows and thus tends to move rods 35a away from the end 314a. On the other hand, coils 32a and 33a are energized so that the field gradient brings the rods back to end 314a when the particle material is in the superconducting state. However, studs 36a, made e.g. of halogenated polycarbide (Teflon or similar material) prevent rods 35a from striking end 314a so that helium can flow in the space between the rods and the end and in the spaces between the rods, which are thus cooled irrespective of their position.

The device in FIG. 11 can be provided either with electric detectors in position 37a (e.g. in ductive or capacitive detectors) or an optical position-finding system similar to that of FIGS. 10a, 10b and 10c. In the latter case, it is sufficient to cover the rod end near the end of the cryostat with a coating which reflects or has a high albedo. The device, incidentally, is reversible. If the current supplying coils 32a and 32b and the flow of fluid are reversed, the rods are moved in the reverse direction by radiation. In general, the efficiency of pickups according to the invention, made up of a number of superconducting particles disposed in a dielectric binder, can be increased by incorporating heavy elements, either in pure chemical form or combined, in the binder, so as to increase the capacity to stop radiation and the consequent probability that photoelectrons will be emitted and cause a transition.

Advantageously the heavy-element filling is made up of small particles (not more than one micron in diameter) of an element having an atomic number above 70, i.e. uranium, bismuth, lead, thallium, etc. The elements may also be incorporated in the form of a compound such as an oxide, halide, carbide or nitride.

We claim:

1. A method of detecting electromagnetic or corpuscular radiation, wherein, in order to detect a radiation photon or particle, a homogeneous particle of superconducting material of the first form is made to change from the metastable form of the superconducting state to the normal state by the action of a photo-electron expelled by the impact of the photon or particle of radiation on the particle of material.

2. A device for detecting electromagnetic or corpuscular radiation, comprising:
(A) a radiation receiver including:
(1) a radiation pick-up including at least one homogeneous particle of superconducting material of the first form,
(2) a cryostat for maintaining the temperature of the material below the critical value, and
(3) means for producing a magnetic field of a predetermined value in the space occupied by the pick-up so as to maintain the material in a metastable super-conducting state in the absence of radiation; and
(B) means for detecting radiation reception signals provided by the receiver including at least one circuit for measuring a quantity or a variation in a quantity linked to the state of the material so as to detect when the material changes from the metastable superconducting to the normal state by action of a photo-electron produced by impact of a radiation particle or photon on the material.

3. A detection device according to claim 2, wherein the pick-up is a single particle.

4. A detection device according to claim 3, wherein the superconducting material is mercury.

5. A detection device according to claim 3, wherein the superconducting material is tin.

6. A detection device according to claim 3, wherein the superconducting material is an indium-bismuth alloy.

7. A detection device according to claim 2, wherein the pick-up is a uniform dispersion of particles in an element made of dielectric material which is solid at the temperature imposed by the cryostat.

8. A detection device according to claim 7, wherein the dielectric material is an epoxy resin.

9. A detection device according to claim 8, wherein the element is a portion of a cylinder.

10. A detection device according to claim 8, wherein the element is a plate.

11. A detection device according to claim 7, wherein the element is a portion of a cylinder.

12. A detection device according to claim 1, wherein the element is a plate.

13. A detection device according to claim 12, wherein the means for measuring a quantity linked to the state of the material is a magneto-optical converter whose input surface is coupled to that surface of the pick-up which is opposite to the surface thereof exposed to radiation.

14. A detection device according to claim 7, wherein the dielectric material is filled with an element having an atomic number higher than 70.

15. A detection device according to claim 14, wherein said element is present in the form of particle having a size of at least one micron.

16. A detection device according to claim 14, wherein said element is present in the form of a chemical compound.

17. A detection device according to claim 2, wherein the measuring circuit comprises at least one coil having at least one turn surrounding at least one particle of semiconducting material and means for detecting the modification in the coefficient of reactance of the coil during the penetration of the magnetic flux associated with the transmission of the superconducting material.

18. A detection device according to claim 17, wherein the measuring circuit is a resonating circuit in which the reactive element is the coil, the circuit comprising means for detecting the change in the resonance frequency of the circuit.

19. A detection device according to claim 17, wherein the measuring circuit also comprises an impedance-increasing transformer having a primary coil connected to the terminals of the coil and a capacity negative-feedback differential amplifier, the inputs of which are connected to the transformer secondary winding and the output of which delivers a voltage signal having an amplitude proportional to the voltage induced in the coil when the material changes state.

20. A detection device according to claim 2, wherein the pick-up comprises a flat element covered with a matrix of induction loops, the device also comprising means for converting induction signals delivered by the loops into numerical signals, storing the signals at adresses corresponding to the positions of the loops within the matrix, and simultaneously delivering, to a write-in display or recording device, the addresses of he loops of the matrix which have simultaneously delivered an induction signal.

21. A detection device according to claim 2, wherein the means for measuring a quantity linked to the state of the material is a magneto-optical converter whose input surface is coupled to that surface of the pick-up which is opposite to the surface thereof exposed to radiation.

22. A device for detecting hard electromagnetic or corpuscular radiation, comprising:
a number of detecting elements situated in a cryostat, said elements having a degree of freedom in translatory motion and containing at least one homogeneous particle of a superconducting material of the first form;
means for producing a magnetic field in the space occupied by a said detecting element or elements, said field having a gradient parallel to the direction of said translatory movement and a value such that the superconducting material in the particle or particles of each said element is maintained in a metastable superconducting state having a direction such that each element is held, by the effect of magnetic levitation applied by the field to the particles, at a distance from a return position determined by a nonmagnetic return force;
means for distinguishing the levitation position of each said element from the return position which it occupies when the material in the particle or particles contained therein has changed from the superconducting to the normal or non-superconducting state under the action of at least one photoelectron, the emission of which is triggered by the radiation.

23. A detection device according to claim 22, wherein the superconducting material is mercury.

24. A detection device according to claim 22, wherein the field gradient is oriented so that the return force is gravity.

25. A detection device according to claim 22, wherein the return force is produced by a flow of cryogenic fluid.

26. A detection device according to claim 22, wherein an optical element is provided for distinguishing the levitation position of each detecting element from its return position, the optical element giving a clear image of at least one part of a detecting element in one position and a blurred image in the other position.

27. A detection device according to claim 22, wherein electrical means are provided for distinguishing the levitation position of each detecting element from its return position.

28. A detection device according to claim 22, wherein the superconducting material is tin.

29. A detection device according to claim 22, wherein the superconducting material is bismuth.

30. A detection device according to claim 22, wherein the superconducting material is an indium-bismuth alloy.

31. A detection device according to claim 22, wherein the superconducting material is lead.

32. A detection device according to claim 22, wherein the superconducting material is thallium.

33. A method for sorting particles of super-conducting material of the first form, which particles have characteristics which permit them to be used in a process for detecting electromagnetic or corpuscular radiation, said method including the step of subjecting said particles, while in a superconducting state, to a magnetic field having a predetermined field gradient, said field gradient having extreme values determined by the energy of the radiation to be detected by said process.

34. Apparatus for sorting particles of super-conducting material for use in a process for detecting electromagnetic or corpuscular radiation, said apparatus comprising a capsule disposed in a cryostat, said capsule being adapted to contain the particles to be stored and being provided with a slide for dividing the volume of said capsule into two vertically juxtaposed spaces, Helmholtz coils disposed around said capsule and producing a uniform non-magnetic field therein, and anti-Helmholtz coils producing a vertically oriented magnetic field gradient in said capsule, said vertically oriented magnetic field gradient superimposed on said uniform field.

35. Apparatus for sorting particles of super-conducting material for use in a process for detecting electromagnetic or corpuscular radiation, said apparatus comprising a vertical duct disposed in a cryostat, said duct including a top portion extending from within said cryostat to a position above said cryostat, said portion of said duct extending above said cryostat including an opening into which particles to be sorted may be poured, said duct also including a bottom portion extending from within said cryostat to an area below said cryostat, said bottom portion of said duct being divided into a first and a second channel by a vertical wall, said first channel being vertically aligned with said first portion of said duct, said second channel being off-set with respect to said first portion of said duct, Helmholtz coils oriented to produce a uniform magnetic field in said duct and anti-Helmholtz coils oriented to produce a horizontally oriented field gradient therein whereby non-superconducting particles poured into said opening fall into said first channel and superconducting particles poured into said opening are deflected into said second channel.

* * * * *